(12) United States Patent
Matsumoto

(10) Patent No.: US 10,511,040 B2
(45) Date of Patent: Dec. 17, 2019

(54) FUEL CELL SYSTEM

(71) Applicant: NISSAN MOTOR CO., LTD., Yokohama-shi, Kanagawa (JP)

(72) Inventor: Michihiko Matsumoto, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 71 days.

(21) Appl. No.: 15/027,504

(22) PCT Filed: Sep. 10, 2014

(86) PCT No.: PCT/JP2014/073995
§ 371 (c)(1),
(2) Date: Apr. 6, 2016

(87) PCT Pub. No.: WO2015/053037
PCT Pub. Date: Apr. 16, 2015

(65) Prior Publication Data
US 2016/0248107 A1    Aug. 25, 2016

(30) Foreign Application Priority Data

Oct. 9, 2013    (JP) .................................. 2013-212132

(51) Int. Cl.
*H01M 8/04537* (2016.01)
*H01M 8/04746* (2016.01)
(Continued)

(52) U.S. Cl.
CPC ..... *H01M 8/04619* (2013.01); *H01M 8/0488* (2013.01); *H01M 8/04559* (2013.01);
(Continued)

(58) Field of Classification Search
CPC ............ B60L 11/1881; G01R 31/3651; G01R 31/362; H02J 3/387; H01M 8/04888;
(Continued)

(56) References Cited

U.S. PATENT DOCUMENTS 8,263,278 B2    9/2012 Imanishi et al.
8,846,259 B2    9/2014 Shimoda et al.
(Continued)

FOREIGN PATENT DOCUMENTS

JP    2007-265686 A    10/2007
JP    2008-103250 A     5/2008
(Continued)

*Primary Examiner* — Jonathan G Jelsma
*Assistant Examiner* — Omar M Kekia
(74) *Attorney, Agent, or Firm* — Foley & Lardner LLP

(57) ABSTRACT

A fuel cell system configured to generate an electric power by supplying an anode gas and a cathode gas to a fuel cell includes: a connection line configured to connect the fuel cell to an electric load; a converter connected to the connection line and a battery, the converter being configured to adjust a voltage of the connection line; a target output current calculating unit configured to calculate a target output current of the fuel cell in accordance with a load of the electric load; a converter control unit configured to carry out a switching control for the converter in accordance with the target output current; and a flow rate control unit configured to control a flow rate of the cathode gas to be supplied to the fuel cell in accordance with the target output current. The target output current calculating unit sets up an upper limit to the target output current on the basis of a generated electric power of the fuel cell and a guaranteed minimum voltage of the connection line for ensuring performance of the fuel cell and the electric load.

4 Claims, 7 Drawing Sheets

(51) Int. Cl.
*H01M 8/04858* (2016.01)
*B60L 58/12* (2019.01)
*G01R 31/3835* (2019.01)
*G01R 31/367* (2019.01)
*B60L 50/72* (2019.01)
*H01M 16/00* (2006.01)
*B60L 58/40* (2019.01)
*H02J 3/38* (2006.01)
*B60L 58/32* (2019.01)

(52) U.S. Cl.
CPC ......... *H01M 8/04753* (2013.01); *B60L 50/72* (2019.02); *B60L 58/12* (2019.02); *B60L 58/32* (2019.02); *B60L 58/40* (2019.02); *G01R 31/367* (2019.01); *G01R 31/3835* (2019.01); *H01M 8/04589* (2013.01); *H01M 8/04888* (2013.01); *H01M 16/006* (2013.01); *H01M 2250/20* (2013.01); *H02J 3/387* (2013.01); *Y02E 60/721* (2013.01); *Y02T 10/705* (2013.01); *Y02T 10/7044* (2013.01); *Y02T 90/32* (2013.01); *Y02T 90/34* (2013.01); *Y04S 10/126* (2013.01)

(58) Field of Classification Search
CPC ........... H01M 16/006; H01M 8/04589; H01M 8/04753; H01M 8/04559; H01M 2250/20; H01M 8/0488; H01M 8/04619; Y02T 90/32

USPC ....................................................... 429/432
See application file for complete search history.

(56) References Cited

U.S. PATENT DOCUMENTS

| | | | |
|---|---|---|---|
| 2007/0275276 A1* | 11/2007 | Saeki | H01M 8/04559 429/431 |
| 2010/0047630 A1 | 2/2010 | Imanishi et al. | |
| 2010/0136451 A1 | 6/2010 | Imanishi et al. | |
| 2010/0248051 A1 | 9/2010 | Shimoda et al. | |
| 2011/0217608 A1* | 9/2011 | Matsumoto | H01M 8/04619 429/428 |
| 2012/0321917 A1* | 12/2012 | Kazuno | H01M 8/04298 429/9 |
| 2013/0288148 A1* | 10/2013 | Kazuno | H01M 8/04089 429/444 |
| 2014/0333316 A1 | 11/2014 | Toida et al. | |

FOREIGN PATENT DOCUMENTS

| | | |
|---|---|---|
| JP | 2010-257928 A | 11/2010 |
| WO | WO 2013/108369 A1 | 7/2013 |

\* cited by examiner

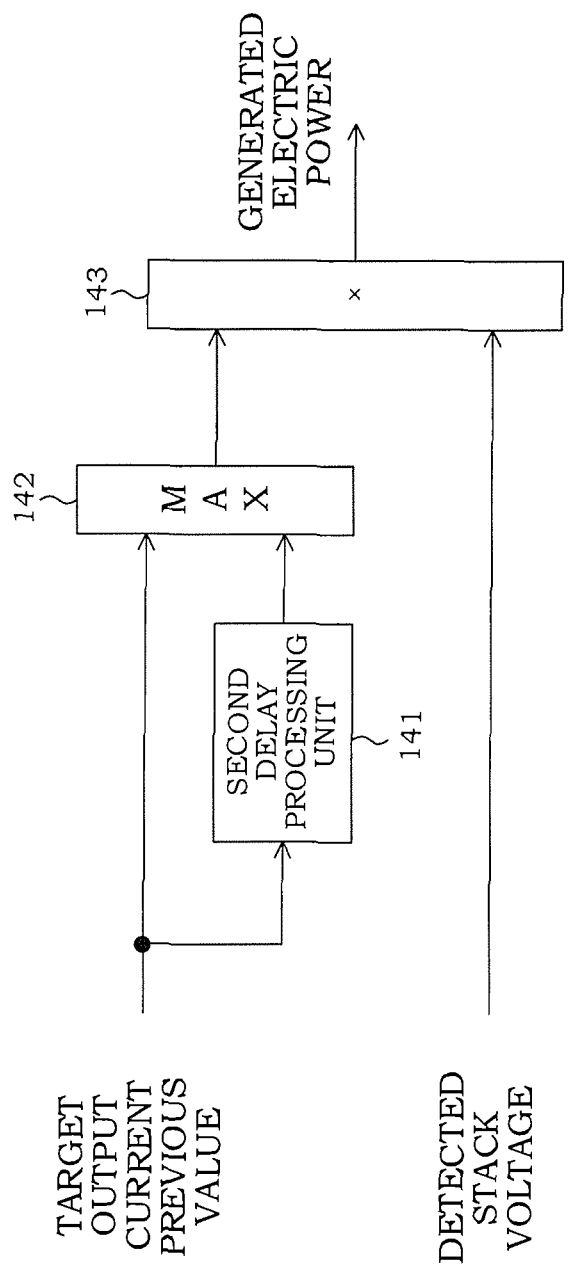

FUEL CELL SYSTEM

TECHNICAL FIELD

The present invention relates to a fuel cell system.

BACKGROUND ART

As a conventional fuel cell system, there is one in which a battery is connected in parallel to a connection line, which electrically connects a fuel cell to a drive motor via an inverter, via a step-up/down converter (see JP2010-257928A).

SUMMARY OF THE INVENTION

A fuel cell system under development now has a system configuration in which a fuel cell is connected to a drive motor via a connection line and a battery is connected to the connection line via a converter. In such a system configuration, an output voltage of the fuel cell is the same electrical potential as an applied voltage of the drive motor.

Further, the fuel cell system also has a control configuration in which a target generated electric power of the fuel cell that is calculated on the basis of a state of an electric load, such as the drive motor and the like, is converted to a target output current according to an IV characteristic of the fuel cell. Moreover, the fuel cell system also has a control configuration in which the converter is switching controlled so that an output current becomes the target output current, a voltage of the connection line (hereinafter, referred to as a "connection line voltage") is controlled, and a control of an air system to control a supply amount of a cathode gas on the basis of the target output current is carried out.

Here, in order to ensure performance and an operation of the fuel cell and the drive motor, a minimum value (hereinafter, referred to as a "guaranteed minimum voltage") is set up for the connection line voltage. In the system configuration described above, the converter of the other control system than a control unit of the air system described above serves as a function to adjust the connection line voltage. For that reason, it is thought a control configuration in which a function to keep to this guaranteed minimum voltage is added to the control system of the converter.

However, in a case where such a control configuration is adopted, the guaranteed minimum voltage can be kept by a control of the connection line voltage using the converter, but information that the connection line voltage is restricted so as not to drop below the guaranteed minimum voltage is not reflected to a control of the air system. As a result, it found that the following problem occurs.

In the fuel cell system as described above, in a case where it is restricted to lower the connection line voltage to less than the guaranteed minimum voltage, the output current of the fuel cell cannot be increased over a certain value even though the cathode gas supply amount is increased by the control of the air system. This makes it impossible for the output current of the fuel cell to reach the target output current. However, since the control of the air system is separate from the control of the converter, information that the connection line voltage is controlled so as not to become less than the guaranteed minimum voltage is not reflected to the control of the air system. Thus, supply of the cathode gas is continued on the basis of the target output current that was set up before the connection line voltage reaches the guaranteed minimum voltage. As a result, an excessive amount of the cathode gas is supplied to the fuel cell, and an electric power generation failure may occur due to excessive drying of an electrolyte membrane in the fuel cell.

The present invention was made by focusing such problems, and it is an object of the present invention to provide a fuel cell system capable of supplying, to a fuel cell, a cathode gas with an appropriate flow rate according to an actual output current while keeping the guaranteed minimum voltage.

According to an aspect of the present invention, there is provided a fuel cell system configured to generate an electric power by supplying an anode gas and a cathode gas to a fuel cell. The fuel cell system includes a connection line configured to connect the fuel cell to an electric load, and a converter connected to the connection line and a battery, the converter being configured to adjust a voltage of the connection line. The fuel cell system calculates a target output current of the fuel cell in accordance with a load of the electric load; carries out a switching control for the converter in accordance with the target output current; and controls a flow rate of the cathode gas to be supplied to the fuel cell in accordance with the target output current. At this time, the fuel cell system sets up an upper limit to the target output current on the basis of a generated electric power of the fuel cell and a guaranteed minimum voltage of the connection line for ensuring performance of the fuel cell and the electric load.

According to this aspect, an output current value by which the voltage of the connection line does not fall below the guaranteed minimum voltage is set up as the upper limit of the target output current on the basis of the generated electric power of the fuel cell and the guaranteed minimum voltage of the connection line. Then, on the basis of the target output current to which this upper limit is set up, the voltage of the connection line is adjusted by means of the switching control, and the flow rate of the cathode gas to be supplied to the fuel cell is controlled.

This makes it possible to set up the target output current for the converter so that the voltage of the connection line does not fall below the guaranteed minimum voltage. Since the flow rate of the cathode gas is also controlled on the basis of this target output current, it is possible to supply, to the fuel cell, the cathode gas with an appropriate flow rate according to an actual output current while keeping the guaranteed minimum voltage.

BRIEF DESCRIPTION OF THE DRAWINGS

FIG. 7 is a block diagram for explaining details of a generated electric power calculating unit of a control program according to a second embodiment of the present invention.

DESCRIPTION OF THE EMBODIMENTS

Hereinafter, embodiments of the present invention will be described with reference to the accompanying drawings.

First Embodiment

In a fuel cell, an electrolyte membrane is sandwiched between an anode electrode (fuel electrode) and a cathode electrode (oxidant electrode), and electric power is generated by supplying an anode gas (fuel gas) containing hydrogen to the anode electrode and supplying a cathode gas (oxidant gas) containing oxygen to the cathode electrode. Electrode reactions that proceed on both the anode electrode and the cathode electrode are as follows.

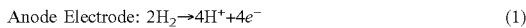
Anode Electrode: $2H_2 \rightarrow 4H^+ + 4e^-$ (1)

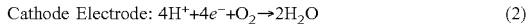
Cathode Electrode: $4H^+ + 4e^- + O_2 \rightarrow 2H_2O$ (2)

The fuel cell generates an electromotive force of about one volt by means of these electrode reactions (1) and (2).

In a case where such a fuel cell is utilized as a power source for a vehicle, the electric power to be required becomes greater. For this reason, the fuel cells are used as a fuel cell stack in which several hundreds of the fuel cells are laminated. Then, by constituting a fuel cell system for supplying the anode gas and the cathode gas to the fuel cell stack, an electric power for driving a vehicle is taken out.

Figure 1:
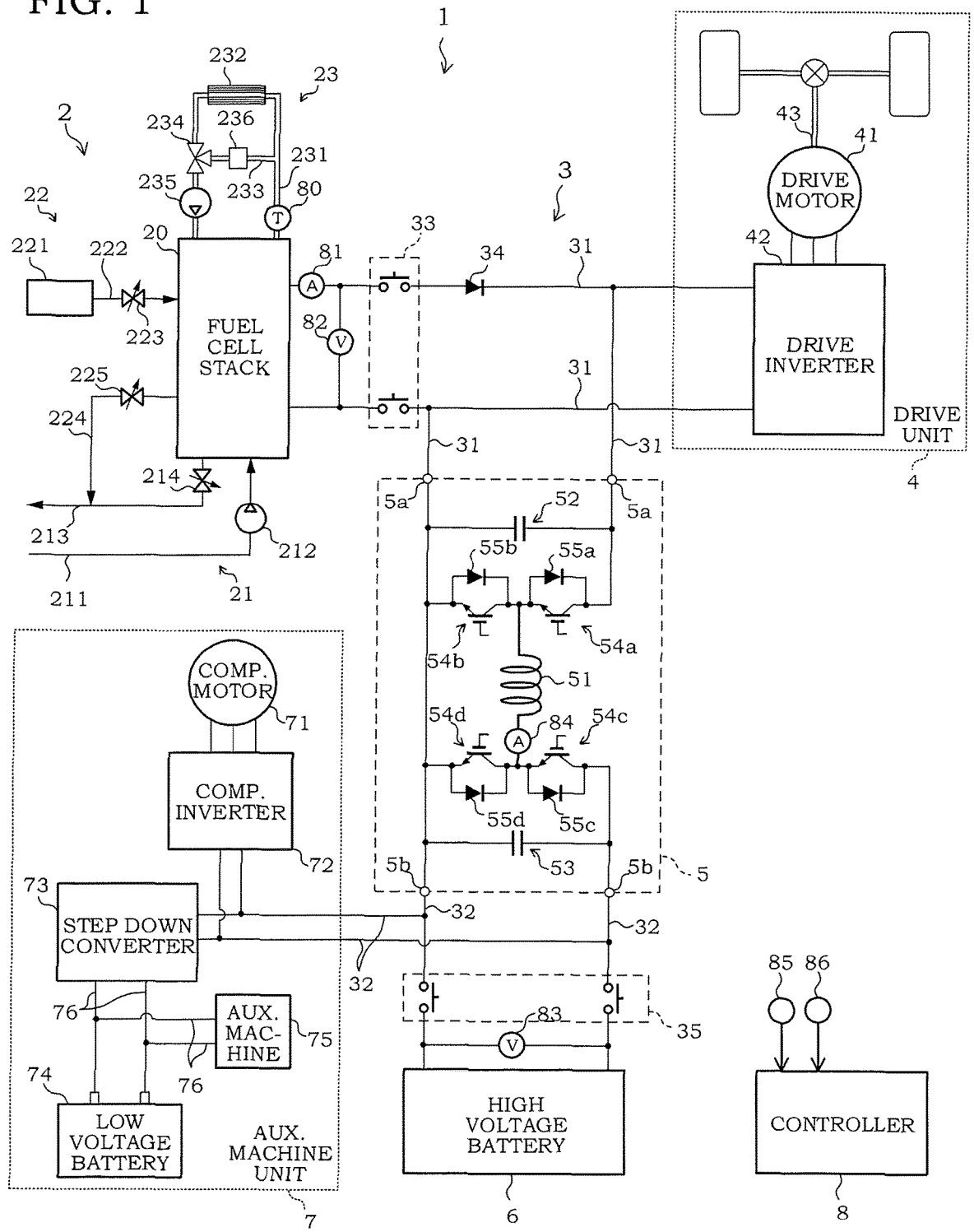
FIG. 1 is a schematic view of a fuel cell system according to a first embodiment of the present invention.

FIG. 1 is a schematic view of a fuel cell system 1 according to a first embodiment of the present invention.

The fuel cell system 1 includes, as a power generating system 2 for generating an electric power, a fuel cell stack 20 as the fuel cell, a cathode gas supply/discharge device 21, an anode gas supply/discharge device 22, and a stack cooling device 23.

The fuel cell stack 20 is constructed by stacking a plurality of fuel cells, and receives the supply of the anode gas and the cathode gas to generate an electric power necessary for driving of the vehicle.

The cathode gas supply/discharge device 21 is a device that supplies the cathode gas to the fuel cell stack 20, and discharges a cathode off-gas discharged from the fuel cell stack 20 to an outside air. The cathode gas supply/discharge device 21 includes a cathode gas supply passage 211, a compressor 212, a cathode gas discharge passage 213, and a cathode pressure regulating valve 214.

The cathode gas supply passage 211 is a passage in which the cathode gas to be supplied to the fuel cell stack 20 flows. One end of the cathode gas supply passage 211 communicates with the outside air, and the other end thereof is connected to a cathode gas inlet port of the fuel cell stack 20.

The compressor 212 is provided on the cathode gas supply passage 211. The compressor 212 takes an air (the outside air) in the cathode gas supply passage 211 as the cathode gas to supply the air to the fuel cell stack 20.

The cathode gas discharge passage 213 is a passage in which the cathode-off gas discharged from the fuel cell stack 20 flows. One end of the cathode gas discharge passage 213 is connected to a cathode gas outlet port of the fuel cell stack 20, and the other end thereof is opened.

The cathode pressure regulating valve 214 is provided on the cathode gas discharge passage 213. The cathode pressure regulating valve 214 adjusts a pressure of the cathode gas to be supplied to the fuel cell stack 20 to a desired pressure. The cathode pressure regulating valve 214 is a solenoid valve that can adjust an opening degree thereof in a continuous or stepwise manner. The opening degree of the cathode pressure regulating valve 214 is controlled by a controller.

The anode gas supply/discharge device 22 is a device that supplies the anode gas to the fuel cell stack 20 and discharges an anode-off gas discharged from the fuel cell stack 20 to the cathode gas discharge passage 213. The anode gas supply/discharge device 22 includes a high-pressure tank 221, anode gas supply passage 222, an anode pressure regulating valve 223, an anode gas discharge passage 224, and a purge valve 225.

The high-pressure tank 221 keeps and stores the anode gas to be supplied to the fuel cell stack 20 in a high-pressure state.

The anode gas supply passage 222 is a passage to supply the anode gas discharged from the high-pressure tank 221 to the fuel cell stack 20. One end of the anode gas supply passage 222 is connected to the high-pressure tank 221, and the other end thereof is connected to an anode gas inlet port of the fuel cell stack 20.

The anode pressure regulating valve 223 is provided on the anode gas supply passage 222. The anode pressure regulating valve 223 adjusts the anode gas discharged from the high-pressure tank 221 to a desired pressure, and supplies it to the fuel cell stack 20. The anode pressure regulating valve 223 is a solenoid valve that can adjust an opening degree thereof in a continuous or stepwise manner. An opening degree of the anode pressure regulating valve 223 is controlled by a controller 8.

The anode gas discharge passage 224 is a passage in which the anode-off gas discharged from the fuel cell stack 20 flows. One end of the anode gas discharge passage 224 is connected to an anode gas outlet port of the fuel cell stack 20, and the other end thereof is connected to the cathode gas discharge passage 213. In this regard, the anode-off gas is a mixture gas of an excessive anode gas that has not been used for an electrode reaction, and an impurity gas cross-leaking from a cathode gas flow channel to an anode gas flow channel in the fuel cell stack 20. The impurity gas contains nitrogen contained in the air, steam generated by the electric power generation and the like.

The purge valve 225 is provided on the anode gas discharge passage 224. Opening and closing of the purge valve 225 is controlled by the controller 8. The purge valve 225 controls a flow rate of the anode-off gas to be discharged from the anode gas discharge passage 224 to the cathode gas discharge passage 213.

The stack cooling device 23 is a device that cools the fuel cell stack 20 by means of cooling water to keep the fuel cell stack 20 to a temperature suitable for electric power generation (for example, 60° C.). The stack cooling device 23 includes a cooling water circulation passage 231, a radiator 232, a bypass passage 233, a three-way valve 234, a circulating pump 235, a heater 236, and a water temperature sensor 80.

The cooling water circulation passage 231 is a passage in which the cooling water for cooling the fuel cell stack 20 circulates.

The radiator 232 is provided on the cooling water circulation passage 231. The radiator 232 cools the cooling water discharged from the fuel cell stack 20.

One end of the bypass passage 233 is connected to the cooling water circulation passage 231, and the other end thereof is connected to the three-way valve 234 so that the cooling water can bypass the radiator 232 to be circulated.

The three-way valve 234 is provided on the cooling water circulation passage 231 downward from the radiator 232. The three-way valve 234 switches circulation routes of the cooling water in accordance with a temperature of the cooling water. More specifically, the three-way valve 234 switches the circulation routes of the cooling water so that the cooling water discharged from the fuel cell stack 20 is supplied to the fuel cell stack 20 via the radiator 232 again when the temperature of the cooling water is relatively high. On the contrary, the three-way valve 234 switches the circulation routes of the cooling water so that the cooling water discharged from the fuel cell stack 20 flows in the bypass passage 233 without the radiator 232 and is supplied to the fuel cell stack 20 again when the temperature of the cooling water is relatively low.

The circulating pump 235 is provided on the cooling water circulation passage 231 downward from the three-way valve 234 to circulate the cooling water.

The heater 236 is provided on the bypass passage 233. A current is supplied to the heater 236 when the fuel cell stack 20 is warmed up to increase the temperature of the cooling water.

The water temperature sensor 80 detects the temperature of the cooling water discharged from the fuel cell stack 20. In the present embodiment, the temperature of the cooling water detected by the water temperature sensor 80 (hereinafter, referred to as a "detected stack temperature") is substituted as a temperature of the fuel cell stack 20.

The fuel cell system 1 includes, as an electric power system 3 connected to the power generating system 2, a drive unit 4, a power manager 5, a high-voltage battery 6, and an auxiliary machine unit 7. The electric power system 3 is configured so as to connect these components by a stack-side connection line 31 and a battery-side line 32 as connection lines.

The stack-side connection line 31 connects an output terminal of the fuel cell stack 20 to a primary terminal 5a of the drive unit 4 and the power manager 5. A current sensor 81, a stack-side voltage sensor 82, a stack breaker 33, and a backflow preventing diode 34 are provided on the stack-side connection line 31.

The current sensor 81 detects a current value taken out from the fuel cell stack 20 (hereinafter, referred to as an "output current"). Hereinafter, the detected value of the current sensor 81 is referred to as a "detected output current".

The stack-side voltage sensor 82 detects a voltage between an output terminal of a positive electrode side of the fuel cell stack 20 and an output terminal of a negative electrode side (an output voltage of the fuel cell stack 20), that is, a voltage between the stack-side connection lines 31 (hereinafter, referred to as a "connection line voltage"). Hereinafter, the detected value of the stack-side voltage sensor 82, that is, the detected voltage of the stack-side connection lines 31 refers to as a "detected connection line voltage".

The stack breaker 33 is a contact-type switcher for mechanically separating the power generating system 2 from the electric power system 3.

The backflow preventing diode 34 prevents a current from flowing back from the electric power system 3 side to the fuel cell stack 20.

The battery-side line 32 respectively connects output terminals of the high-voltage battery 6 to secondary terminals 5b of the auxiliary machine unit 7 and the power manager 5. A battery-side voltage sensor 83 and a battery breaker 35 are provided on the battery-side line 32.

The battery-side voltage sensor 83 detects a voltage between a positive electrode side output terminal and a negative electrode side output terminal of the high-voltage battery 6, that is, a voltage between the battery-side lines 32 (hereinafter, referred to as a "battery voltage").

The battery breaker 35 is a contact-type switcher for mechanically separating the high-voltage battery 6 from the electric power system 3.

The drive unit 4 is an electric load that is connected to the fuel cell stack 20 and is also connected to the high-voltage battery 6 via the power manager 5. The drive unit 4 includes a drive motor 41 and a drive inverter 42.

The drive motor 41 is a three-phase synchronous motor in which permanent magnets are embedded in a rotor and a stator coil is wound around a stator. An axis of rotation of the drive motor 41 is coupled to a drive shaft 43 of a vehicle. The drive motor 41 has a function as an electric motor that receives supply of the electric power from the fuel cell stack 20 and the high-voltage battery 6 to be rotatably driven, and a function as a power generator that generates an electromotive force between both ends of the stator coil at the time of deceleration of the vehicle in which the rotor is caused to rotate by means of an external force.

An input terminal of the drive inverter 42 is connected to the stack-side connection line 31, and an output terminal thereof is connected to the drive motor 41. The drive inverter 42 is constructed from a plurality of switching elements, such as an IGBT (Insulated Gate Bipolar Transistor), for example. The switching elements of the drive inverter 42 is switching controlled by the controller 8, whereby a DC electric power is converted to an AC electric power or the AC electric power is converted to the DC electric power. When the drive motor 41 is caused to serve as an electric motor, the drive inverter 42 converts a combined DC electric power of the generated electric power of the fuel cell stack 20 and an output electric power of the high-voltage battery 6 to a three-phase AC electric power, and supplies it to the drive motor 41. On the other hand, when the drive motor 41 is caused to serve as a generator, the drive inverter 42 converts a regenerative electric power of the drive motor 41 (the three-phase AC electric power) to the DC electric power, and supplies it to the high-voltage battery 6.

The power manager 5 is a converter that increases (i.e., boosts) or decreases at least one of the connection line voltage and the battery voltage. The primary terminal 5a of the power manager 5 is connected to the stack-side connection line 31, and the secondary terminal 5b thereof is connected to the battery-side line 32. By controlling the connection line voltage by means of the power manager 5, the generated electric power of the fuel cell stack 20 (the connection line voltage×the output current) is controlled, and charge/discharge of the high-voltage battery 6 is controlled. In the present embodiment, a bidirectional voltage boosting circuit is utilized as the power manager 5 (step-up/down converter). The power manager 5 is a polyphase converter with a three-phase configuration. However, only one phase configuration is shown herein for convenience.

The power manager 5 includes a reactor 51, a stack-side capacitor 52, a battery-side capacitor 53, switching elements 54a to 54d, diodes 55a to 55d, and a current sensor 84.

Each of the switching elements 54a to 54d is constituted by an IGBT (Insulated Gate Bipolar Transistors), for example. The switching elements 54a to 54d are switching controlled by the controller 8. At least one of a voltage of the stack-side capacitor 52 and a voltage of the battery-side capacitor 53 is increased or decreased by the switching control.

The diodes 55a to 55d are respectively connected to the switching elements 54a to 54d in parallel. The diodes 55a to 55d are arranged so that a forward direction of each of the diodes 55a to 55d gets into reversed with respect to a direction of the current that flows in the switching element.

A PWM signal (Pulse Width Modulation) for carrying out a switching control is inputted to a control terminal of each of the switching elements 54a to 54d by the controller 8. By changing a duty ratio of the PWM signal, it is possible to increase or decrease a current that flows in the reactor 51.

The current sensor 84 detects a current that passes through the power manager 5.

Hereinafter, a control of the switching elements 54a to 54d at the time of discharge by a boost operation from the high-voltage battery 6 to the drive unit 4 will be described briefly as one example of an operation of the power manager 5.

Both the switching element 54b and the switching element 54c are first controlled to a conduction state (ON) when each of the switching elements 54a to 54d is in a non-conduction state (OFF). This causes a current route of the power manager 5 to be set up to a route in which the current flows from the switching element 54c to the switching element 54b via the reactor 51, whereby an exciting current is supplied from the battery-side capacitor 53 to the reactor 51. Namely, the exciting energy is stored in the reactor 51 from the battery-side capacitor 53.

By controlling the switching element 54b to the non-conduction state at this stage, the exciting current flowing in the reactor 51 causes the switching element 54c and the diode 55a to be conducted together. This causes the current route of the power manager 5 to be switched to a route in which the current flows from the switching element 54c to the diode 55a via the reactor 51, whereby the exciting current flowing in the reactor 51 is supplied to the stack-side capacitor 52. Namely, the exciting energy stored in the reactor 51 is released to the stack-side capacitor 52.

Thus, the electric power of the high-voltage battery 6 is supplied to the drive unit 4 via the stack-side capacitor 52.

Next, a control of the switching elements 54a to 54d at the time of charge by a boost operation from the fuel cell stack 20 to the high-voltage battery 6 will be described briefly.

Both the switching element 54a and the switching element 54d are first controlled to an on state, when each of the switching elements 54a to 54d is in an off state. This causes the current route of the power manager 5 to be set up to a route in which the current flows from the switching element 54a to the switching element 54d via the reactor 51, whereby the exciting current is supplied from the stack-side capacitor 52 to the reactor 51. Namely, the exciting energy is stored in the reactor 51 from the stack-side capacitor 52.

By controlling the switching element 54d to the off state at this stage, the exciting current flowing in the reactor 51 causes the switching element 54a and the diode 55c to be conducted together. This causes the current route of the power manager 5 to be switched to a route in which the current flows from the switching element 54a to the diode 55c via the reactor 51, whereby the exciting current flowing in the reactor 51 is supplied to the battery-side capacitor 53. Namely, the exciting energy stored in the reactor 51 is released to the battery-side capacitor 53.

Thus, the generated electric power of the fuel cell stack 20 is supplied to the high-voltage battery 6 via the stack-side capacitor 52.

The high-voltage battery 6 is a chargeable secondary battery, and an output terminal thereof is connected to the battery-side line 32. The generated electric power of the fuel cell stack 20 and the regenerative electric power of the drive motor 41 are charged in the high-voltage battery 6. The electric power charged in the high-voltage battery 6 is supplied to the drive unit 4 and the auxiliary machine unit 7 as necessary. In the present embodiment, a lithium-ion battery whose output voltage is about 300 (V) is utilized as the high-voltage battery 6.

The auxiliary machine unit 7 is an electric load that is connected to the high-voltage battery 6 and is also connected to the fuel cell stack 20 via the power manager 5. The auxiliary machine unit 7 includes a compressor motor 71, a compressor inverter 72, a step-down converter 73, a low-voltage battery 74, an auxiliary machine 75, and a low-voltage line 76.

The compressor motor 71 is a three-phase synchronous motor for driving the compressor 212.

An input terminal of the compressor inverter 72 is connected to the battery-side line 32, and an output terminal thereof is connected to the compressor motor 71. The compressor inverter 72 is constructed from a plurality of switching elements such as an IGBT (Insulated Gate Bipolar Transistor), for example. Switching of each of the switching elements of the compressor inverter 72 is controlled by the controller 8. This switching control causes the compressor inverter 72 to convert a DC electric power to an AC electric power, and supplies it to the compressor motor 71.

A primary terminal of the step-down converter 73 is connected to the battery-side line 32, and a secondary terminal thereof is connected to the low-voltage line 76. The step-down converter 73 is controlled by the controller 8 to reduce the voltage generated in the battery-side capacitor 53 to a voltage level of the low-voltage battery 74 and to supply an electric power to the auxiliary machine 75 connected to the low-voltage line 76.

The low-voltage battery 74 is a chargeable secondary battery, and an output terminal thereof is connected to the low-voltage line 76. The low-voltage battery 74 stores an electric power for supplying to the auxiliary machine 75 at the time of a starting process or a stopping process of the fuel cell system 1 when the fuel cell stack 20 does not generate an electric power. In the present embodiment, a lead-acid storage battery whose output voltage is about 14 (V) is utilized as the low-voltage battery 74.

The auxiliary machine 75 is various kinds of electric power equipment that are used at the time of an operation of the fuel cell system 1. For example, valves such as the cathode pressure regulating valve 214 and the like described above, lighting devices, and the like are included therein. The auxiliary machine 75 is connected to the low-voltage line 76.

The low-voltage line 76 connects an output terminal of the low-voltage battery 74 to the secondary terminal of the step-down converter 73 and the auxiliary machine 75.

The controller 8 is configured by a microcomputer that includes a Central Processing Unit (CPU), a Read Only Memory (ROM), a Random Access Memory (RAM) and an input/output interface (I/O interface). Signals from various kinds of signals necessary for operating the fuel cell system 1 are inputted to the controller 8 in addition to the group of sensors 80 to 84 as described above. The signals include signals of: an accelerator stroke sensor 85 for detecting a pressing amount of an accelerator pedal (hereinafter, referred to as an "accelerator operating amount"); and an SOC sensor 86 for detecting a charged capacity of the high-voltage battery 6 (SOC; State Of Charge).

Figure 2:
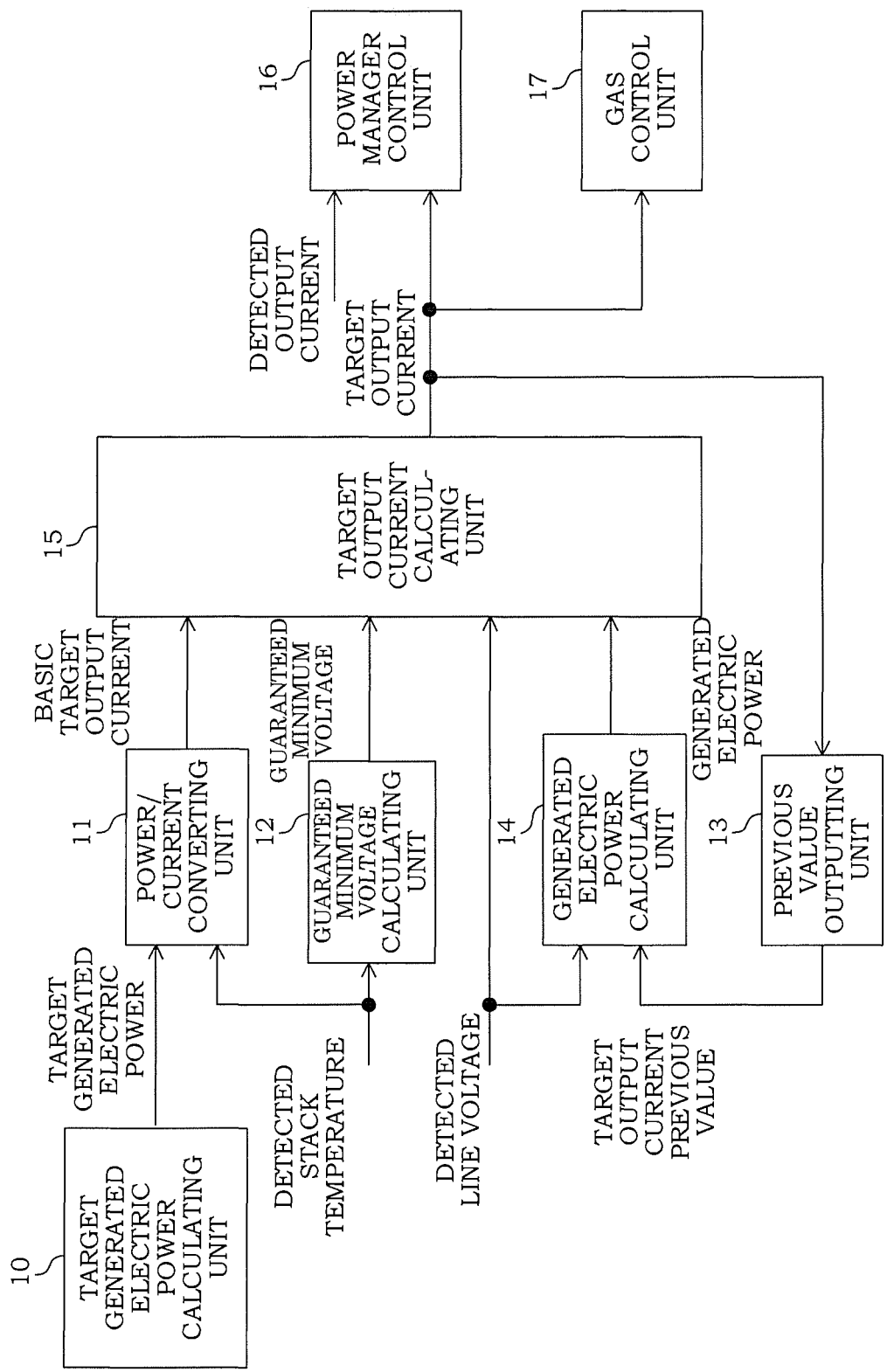
FIG. 2 is a block diagram for explaining the content of a control program according to the first embodiment of the present invention.

FIG. 2 is a block diagram for explaining the content of a control program according to the present embodiment carried out by the controller 8.

The controller 8 includes a target generated electric power calculating unit 10, a power/current converting unit 11, a guaranteed minimum voltage calculating unit 12, a previous value outputting unit 13, a generated electric power calculating unit 14, a target output current calculating unit 15 as a target output current calculating unit, a power manager control unit 16 as a converter control unit, and a gas control unit 17 as a flow rate control unit.

The target generated electric power calculating unit 10 calculates a target value of the generated electric power (hereinafter, referred to as a "target generated electric power") of the fuel cell stack 20 in accordance with an operational state of the electric load, such as the drive motor 41, the compressor motor 71 and the auxiliary machine 75, and a charge rate of the high-voltage battery 6.

More specifically, the target generated electric power calculating unit 10 calculates the target generated electric power in accordance with the electric load so that the larger the target generated electric power becomes, the higher a load of the electric load becomes. Then, the target generated electric power calculated in accordance with the electric load is corrected so that the target generated electric power becomes larger by an electric power required for charge when the charge rate of the high-voltage battery 6 is low and there is a charge request for the high-voltage battery 6. On the other hand, the target generated electric power calculated in accordance with the electric load is corrected so that the target generated electric power becomes smaller by an electric power required for discharge when the charge rate of the high-voltage battery 6 is high and there is a discharge request for the high-voltage battery 6.

In this way, the target generated electric power calculating unit 10 basically calculates the target generated electric power in accordance with the electric load, and corrects the calculated target generated electric power if necessary.

Figure 3:
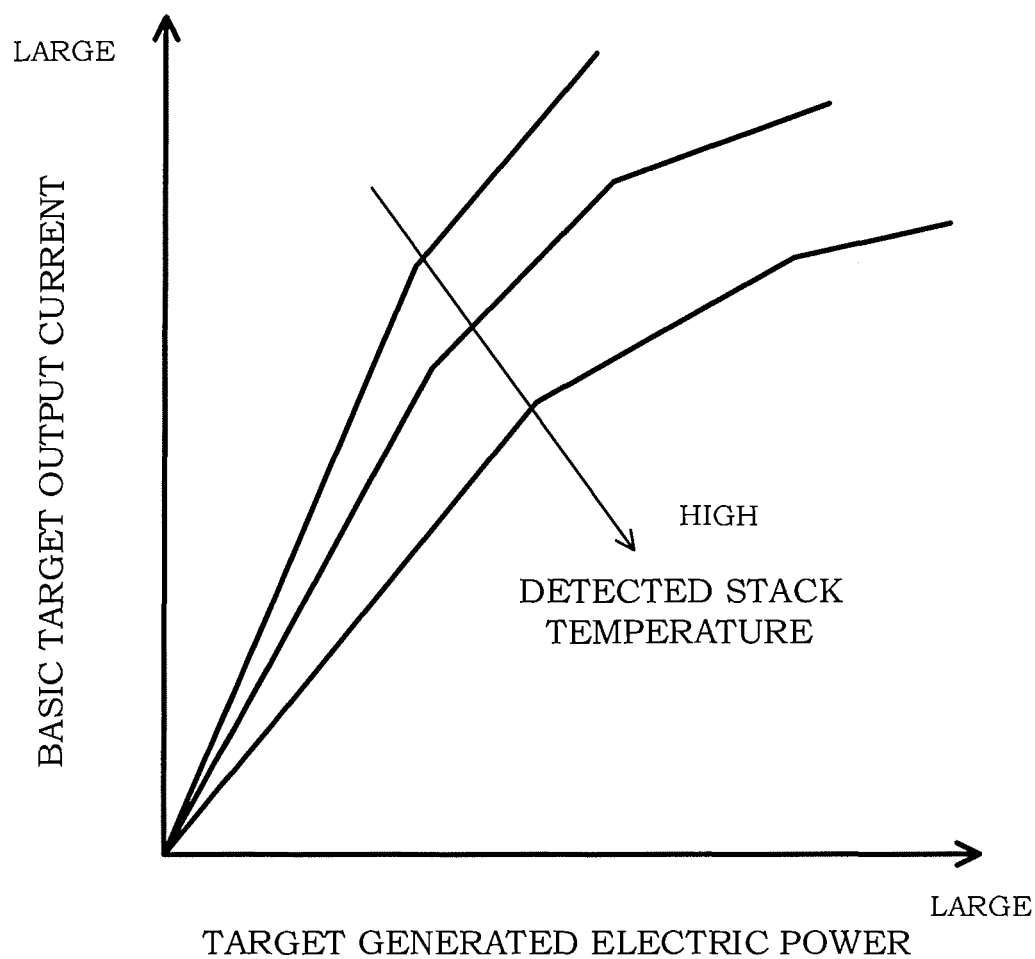
FIG. 3 is a PI characteristic map showing a relationship between a generated electric power of a fuel cell stack and an output current.

The target generated electric power and the detected stack temperature are inputted to the power/current converting unit 11. The power/current converting unit 11 refers to a PI characteristic map of FIG. 3, which shows a relationship of the generated electric power of the fuel cell stack 20 and the output current, and calculates a target value of the output current necessary for generating the target generated electric power (hereinafter, referred to as a "basic target output current"). In this regard, as shown in the PI characteristic map of FIG. 3, the higher the detected stack temperature becomes, the smaller the basic target output current necessary for generating the target generated electric power. This is because power generation efficiency of the fuel cell stack 20 becomes higher as the detected stack temperature becomes higher from an outside temperature, for example, toward a temperature suitable for generating an electric power (for example, 60° C.).

Figure 4:
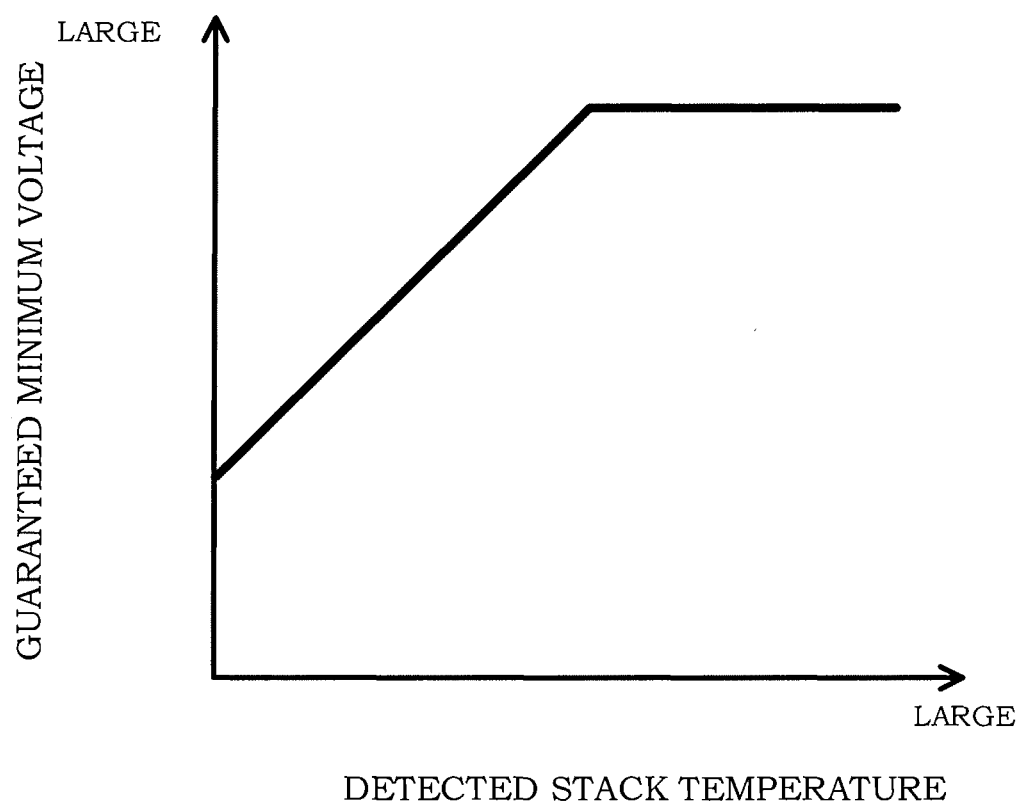
FIG. 4 is a table for calculating the guaranteed minimum voltage on the basis of a detected stack temperature.

The detected stack temperature is inputted to the guaranteed minimum voltage calculating unit 12. The guaranteed minimum voltage calculating unit 12 refers to a table of FIG. 4 to calculate the guaranteed minimum voltage on the basis of the detected stack temperature. Here, the guaranteed minimum voltage means the minimum value of the connection line voltage by which an operation and performance of the fuel cell stack 20 and the drive motor 41 can be ensured. Namely, the guaranteed minimum voltage is the minimum value of the connection line voltage to which the connection line voltage should keep in order to operate the fuel cell system 1.

The target output current calculated by the target output current calculating unit 15 is inputted to the previous value outputting unit 13. The previous value outputting unit 13 stores the target output current thus inputted, and outputs the target output current thus inputted as a target output current previous value at the time of next calculation.

The detected connection line voltage and the target output current previous value are inputted to the generated electric power calculating unit 14. The generated electric power calculating unit 14 multiplies the detected connection line voltage and the target output current previous value together to calculate the generated electric power of the fuel cell stack 20.

Thus, in the present embodiment, one obtained by multiplying the detected connection line voltage and the detected output current is not used as the generated electric power of the fuel cell stack 20, but one obtained by multiplying the detected connection line voltage and the target output current previous value is used as the generated electric power of the fuel cell stack 20.

The basic target output current, the guaranteed minimum voltage, the detected connection line voltage and the generated electric power are inputted to the target output current calculating unit 15. The target output current calculating unit 15 calculates a target output current on the basis of these input values. Details of the target output current calculating unit 15 will be described later with reference to FIG. 6.

The detected output current and the target output current are inputted to the power manager control unit 16. The power manager control unit 16 calculates a target connection line voltage using a feedback control, such as a PI control, for example, so that a deviation between the detected output current and the target output current becomes zero. Then, each of the switching elements 54a to 54d is switching controlled so that the voltage of the stack-side capacitor 52 (the detected connection line voltage) becomes the target connection line voltage. The power manager control unit 16 carries out the switching control in accordance with the target output current in this manner.

The target output current is inputted to the gas control unit 17. The gas control unit 17 calculates target values of a cathode gas flow rate and a cathode gas pressure on the basis of the target output current, and controls the compressor 212 and the cathode pressure regulating valve 214 on the basis of calculation results. The target values of the cathode gas flow rate and the cathode gas pressure basically becomes larger as the target output current becomes larger. Further, the gas control unit 17 calculates a target value of an anode gas pressure on the basis of the target output current, and controls the anode pressure regulating valve 223 on the basis of a calculation result.

Figure 5:
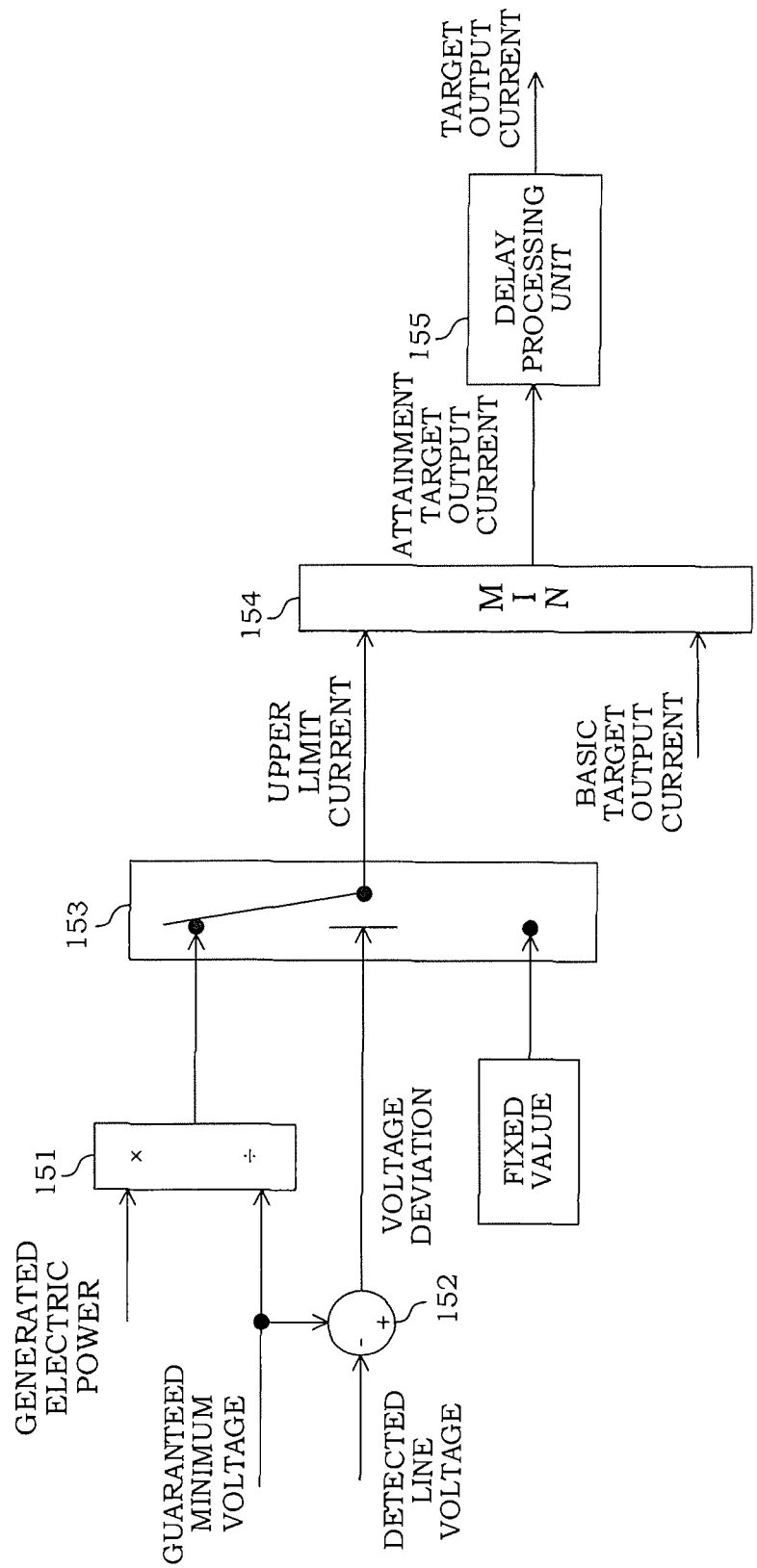
FIG. 5 is a block diagram for explaining details of a target output current calculating unit.

FIG. 5 is a block diagram for explaining details of the target output current calculating unit 15.

The target output current calculating unit 15 includes a dividing unit 151, a voltage deviation calculating unit 152, an upper limit current setting unit 153, an attainment target output current setting unit 154, and a delay processing unit 155.

The dividing unit 151 divides the generated electric power by the guaranteed minimum voltage to calculate an output current value required for generating an electric power corresponding to the generated electric power when the connection line voltage is the guaranteed minimum voltage. When an output current becomes larger than this output current value, the connection line voltage falls below the guaranteed minimum voltage.

The voltage deviation calculating unit 152 subtracts the guaranteed minimum voltage from the detected connection line voltage to calculate a voltage deviation.

The output current value calculated by the dividing unit 151, a fixed value set up in advance, and the voltage deviation are inputted to the upper limit current setting unit 153. When the voltage deviation is a predetermined deviation or lower, the upper limit current setting unit 153 sets up the output current value calculated by the dividing unit 151 as an upper limit value of the output current (hereinafter, referred to as an "upper limit current"). On the other hand, when the voltage deviation is larger than the predetermined deviation, the upper limit current setting unit 153 sets up the fixed value as the upper limit current. For example, the smallest value of a value of the maximum value or more of the output current determined from performance of the fuel cell stack 20 and the maximum value of the output current determined from thermal constraints of the backflow preventing diode 34 and the stack-side connection line 31 in which the output current of the fuel cell stack 20 flows is used as the fixed value.

Thus, the upper limit current setting unit 153 does not restrict the upper limit of the output current when the voltage deviation is larger than the predetermined deviation. However, the upper limit current setting unit 153 restricts the upper limit of the output current when the voltage deviation is the predetermined deviation or lower, that is, when the detected connection line voltage is lowered to a vicinity of the guaranteed minimum voltage. Thus, by setting up the upper limit to the output current after it is confirmed that the detected connection line voltage drops to a vicinity of the guaranteed minimum voltage, the output current is prevented from being carelessly restricted.

The upper limit current and the basic target output current are inputted to the attainment target output current setting unit 154. the attainment target output current setting unit 154 compares the upper limit current and the basic target output current in magnitude, and sets up the smaller one as an attainment target output current.

The attainment target output current is inputted to the delay processing unit 155. The delay processing unit 155 outputs a value obtained by removing a high frequency component of the attainment target output current therefrom by a low-pass filter as the target output current. Namely, the target output current is a target value for controlling the output current toward the attainment target output current with a predetermined time delay.

A reason why the value obtained by removing the high frequency component of the attainment target output current therefrom by the low-pass filter in this manner is set up as the target output current will be described with reference to FIG. 6.

Figure 6:
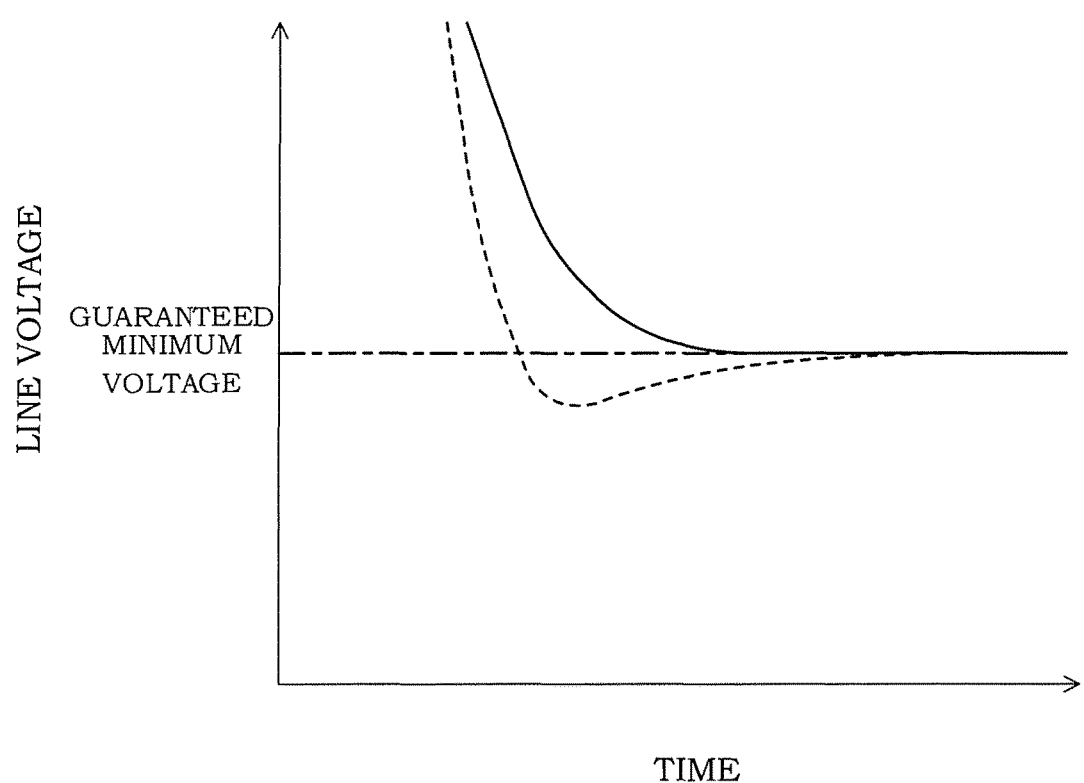
FIG. 6 is a view in which a change in a connection line voltage when an attainment target output current sharply increases is compared between a case of subjecting a low-pass filtering process and a case of not subjecting the low-pas filtering process.

FIG. 6 is a view in which at a transient time when the attainment target output current changes, a case where a low-pass filtering process is subjected to a change in the connection line voltage when an amount of change in the attainment target output current is large and the attainment target output current steeply increases by the delay processing unit 155 (a solid line) is compared with a case where the low-pass filtering process is not subjected thereto (a broken line).

In general, many high frequency components are contained in a signal having a rapid rise. Therefore, in a case where the attainment target output current steeply increases and the low-pass filtering process is not subjected, the output current steeply changes toward the attainment target output current. For this reason, a current containing the many high frequency components flows. Then, the current containing the many high frequency components passes through an electric double-layer capacitor of the fuel cell stack 20.

For that reason, there is a fear that when the attainment target output current increases steeply, the output current more than the attainment target output current transiently flows, and as shown in FIG. 6, the connection line voltage falls below the guaranteed minimum voltage. In addition, the upper limit current is calculated on the basis of the detected connection line voltage. Thus, in a case where a response delay from the target output current to the detected connection line voltage is not thought, there is a fear that the connection line voltage similarly falls below the guaranteed minimum voltage.

On the other hand, by subjecting the low-pass filtering process to the attainment target output current to remove the high frequency component, it is possible to change the output current toward the attainment target output current in a gradual manner. Therefore, as shown in FIG. 6, it is possible to suppress the connection line voltage from falling below the guaranteed minimum voltage. It is preferable that the low-pass filter is set up in view of the electric double-layer capacitor of the fuel cell stack 20 in order to remove a current with high frequency that passes through the electric double-layer capacitor of the fuel cell stack 20. Moreover, it is preferable to set up the low-pass filter in view of the response delay from the target output current to the detected connection line voltage.

As explained above, the fuel cell system 1 according to the present embodiment includes: the stack-side connection line 31 that connects the fuel cell stack 20 to the drive unit 4, which is the electric load; and the power manager 5 that adjusts the voltage of the stack-side connection line 31 (the connection line voltage) in which the primary terminal 5a thereof is connected to the stack-side connection line 31 and the secondary terminal 5b thereof is connected to the high-voltage battery 6. Further, the fuel cell system 1 calculates the target output current of the fuel cell stack 20 in accordance with a load of the electric load; carries out the switching control of the power manager 5 in accordance with the target output current; and controls the flow rate of the cathode gas to be supplied to the fuel cell stack 20.

In this case, the fuel cell system 1 according to the present embodiment sets up the upper limit to the target output current of the fuel cell stack 20 on the basis of the generated electric power of the fuel cell stack 20 and the guaranteed minimum voltage of the stack-side connection line 31 for ensuring performance of the fuel cell stack 20 and the electric load.

Thus, in the present embodiment, the output current value necessary for generating the electric power of the generated electric power when the voltage of the stack-side connection line 31 is the guaranteed minimum voltage is set up as the upper limit of the target output current on the basis of the generated electric power of the fuel cell stack 20 and the guaranteed minimum voltage of the stack-side connection line 31. Then, the voltage of the stack-side connection line 31 is adjusted by the switching control of the power manager 5 on the basis of the target output current to which this upper limit is set up, and the flow rate of the cathode gas to be supplied to the fuel cell stack 20 is controlled.

This makes it possible to set up the target output current for the power manager 5 so that the voltage of the stack-side connection line 31 does not fall below the guaranteed minimum voltage. Since the flow rate of the cathode gas is also controlled on the basis of this target output current, it is possible to supply, to the fuel cell, the cathode gas with an appropriate flow rate according to an actual output current while keeping the guaranteed minimum voltage.

Further, the fuel cell system 1 according to the present embodiment sets up the upper limit to the target output current of the fuel cell stack 20 when the voltage deviation obtained by subtracting the guaranteed minimum voltage from the voltage of the stack-side connection line 31 is the predetermined deviation or lower.

Thus, by setting up the upper limit to the output current after it is confirmed that the voltage of the stack-side connection line 31 drops to the vicinity of the guaranteed minimum voltage, it is possible to prevent the output current from being restricted carelessly.

Further, the fuel cell system 1 according to the present embodiment subjects the low-pass filtering process to the target output current, and removes the high frequency component of the target output current therefrom.

This makes it possible to change the output current toward the target output current in a gradual manner even in a case where the target output current is increased steeply. Therefore, it is possible to suppress the voltage of the stack-side connection line 31 from falling below the guaranteed minimum voltage.

Further, the fuel cell system 1 according to the present embodiment is configured so as not to calculate the generated electric power of the fuel cell stack 20 on the basis of the detected connection line voltage and the detected output current, but to calculate it on the basis of the detected connection line voltage and the target output current. More specifically, the value obtained by multiplying the target output current previous value as one example of the target output current by the detected connection line voltage is used as the generated electric power of the fuel cell stack 20.

In a case where the detected connection line voltage is controlled to the target connection line voltage by the power manager 5, the power manager 5 switching controls each of the switching elements 54a to 54d so that the voltage of the stack-side capacitor 52 becomes the target connection line voltage as described above.

More specifically, when the voltage of the stack-side capacitor 52 becomes the target connection line voltage, the power manager 5 switches flow directions of the exciting current that flows in the reactor 51 by the switching control, and repeats supply and release of the exciting energy against the stack-side capacitor 52, whereby the voltage of the stack-side capacitor 52 is maintained to the target connection line voltage.

Here, in order to switch the flow directions of the exciting current that flows in the reactor 51 by the switching control, for example, it is need to switch from a state where each of the switching elements 54b, 54c is turned ON and each of the switching elements 54a, 54d is turned OFF to a state where each of the switching elements 54b, 54c is turned OFF and each of the switching elements 54a, 54d is turned ON. In a case where either the switching elements 54a, 53b or the switching elements 54c, 54d are in the ON state at the same time when to switch ON/OFF, a short circuit occurs therein. Accordingly, in the present embodiment, in order to prevent the short circuit, a dead time in which all of the switching elements 54a to 54d are turned OFF for a while, and the ON/OFF switching is carried out.

Therefore, since a delay occurs until the flow directions of the exciting current that flows in the reactor 51 are switched by the switching control, there is a fear that hunting of the detected output current occurs against the target output current. For that reason, in a case where the generated electric power is calculated using the detected output current whose sensitivity with respect to a variation in the generated electric power is large, there is a fear that hunting of the upper limit current calculated on the basis of the generated electric power also occurs and the connection line voltage thereby falls below the guaranteed minimum voltage.

Thus, in the present embodiment, the generated electric power is to be calculated using the target output current. This causes the upper limit current calculated on the basis of the generated electric power to be prevented from hunting. Therefore, it is possible to suppress the connection line voltage from falling below the guaranteed minimum voltage.

Second Embodiment

Next, the content of a control program according to a second embodiment of the present invention will be described. A control program according to the present embodiment is different from that according to the first embodiment with respect to the content of the generated electric power calculating unit 14. Hereinafter, its difference will be described mainly. It should be noted that components serving as the similar functions in the first embodiment described above are denoted by the same reference numerals, and the overlapping explanation will be omitted appropriately.

FIG. 7 is a block diagram for explaining details of the generated electric power calculating unit 14 of the control program according to the present embodiment.

In the first embodiment described above, the value obtained by multiplying the target output current previous value and the detected line voltage is used as the generated electric power.

On the contrary, in the present embodiment, a second delay processing unit 141 subjects a low-pass filtering process, in view of a response speed of the power manager 5 when the connection line voltage is controlled to the target connection line voltage by the power manager 5, to the target output current previous value. Namely, the second delay processing unit 141 outputs a current value corresponding to a change in an actual output current value when the power manager 5 controls the connection line voltage to the target connection line voltage.

Then, a maximum value selecting unit 142 selects larger one of the target output current previous value and an output value of the second delay processing unit 141, and a generated electric power outputting unit 143 outputs a value obtained by multiplying the value selected by the maximum value selecting unit 142 and a detected stack voltage as the generated electric power. Hereinafter, a reason why to done in this manner will be described.

At a down transient time in which the target output current is lowered, the target output current previous value may become smaller than an output current value to which the power manager 5 can reduce it actually. In this case, when the generated electric power is calculated on the basis of the target output current previous value, the generated electric power calculated by the generated electric power calculating unit 14 becomes smaller than an actual generated electric power. As a result, the upper limit current calculated on the basis of the generated electric power calculated by the generated electric power calculating unit 14 also becomes lower, and this causes the output current to be restricted excessively.

On the other hand, in the present embodiment, by configuring the generated electric power calculating unit 14 as described above, it is possible to calculate the generated electric power on the basis of the current value corresponding to the change in the actual output current value. For that reason, since it is possible to suppress the generated electric power calculated by the generated electric power calculating unit 14 from becoming smaller than the actual generated electric power, it is possible to suppress the output current from being restricted excessively.

As explained above, the fuel cell system 1 according to the present embodiment calculates the generated electric power of the fuel cell stack 20 on the basis of the detected connection line voltage and larger one of the value obtained by subjecting the low-pass filtering process to the target output current and the value obtained by further subjecting the low-pass filtering process in view of responsiveness of the power manager 5 to the value thus obtained.

This makes it possible to suppress the generated electric power calculated by the generated electric power calculating unit 14 from becoming smaller than the actual generated electric power at the down transient time. Therefore, it is possible to suppress the upper limit current calculated on the basis of the generated electric power calculated by the generated electric power calculating unit 14 from being set up to an unnecessarily smaller value.

As described above, although the embodiments of the present invention have been explained, the above embodiments merely illustrate a part of examples of application of the present invention, and it does not mean that a technical scope of the present invention is limited to a specific configuration of each of the embodiments described above.

For example, in each of the embodiments described above, the target output current previous value is inputted to the generated electric power calculating unit 14. However, this is one example of the target output current, and it is not limited to the previous value. Further, the guaranteed minimum voltage may be set up as a voltage value by which the operation and performance of at least either one of the fuel cell stack 20 and the drive motor 41 can be ensured.

The present application claims priority based on Japanese Patent Application No. 2013-212132, filed with the Japan Patent Office on Oct. 9, 2013, the entire content of which is expressly incorporated herein by reference.

The invention claimed is:

1. A fuel cell system configured to generate electric power by supplying an anode gas and a cathode gas to a fuel cell, the fuel cell system comprising:
    a connection line configured to connect the fuel cell to an electric load;
    a converter connected to the connection line and a battery, the converter being configured to adjust a voltage of the connection line; and
    a controller programmed to:
    calculate a target output current of the fuel cell in accordance with a load of the electric load;
    carry out a switching control for the converter in accordance with the target output current;
    control a flow rate of the cathode gas to be supplied to the fuel cell in accordance with the target output current; and
    calculate the generated electric power of the fuel cell on the basis of a previous value of the target output current calculated by the controller and a detected voltage of the connection line,
    wherein the controller is programmed to set up an upper limit to the target output current on the basis of a generated electric power of the fuel cell calculated by the controller and a guaranteed minimum voltage of the connection line for ensuring performance of the fuel cell and the electric load.

2. The fuel cell system according to claim 1, wherein the controller is programmed to subject the target output current to a low-pass filtering process.

3. The fuel cell system according to claim 1, wherein the controller is programmed to calculate the generated electric power of the fuel cell on the basis of the detected voltage of the connection line and a larger one of a value obtained by subjecting the target output current to a low-pass filtering process and a value obtained by subjecting the value in view of responsiveness of the converter to a low-pass filtering process.

4. The fuel cell system according to claim 1, wherein the controller is programmed to set up the upper limit of the target output current when a voltage deviation obtained by subtracting a guaranteed minimum voltage from the voltage of the connection line is a predetermined deviation or lower.

* * * * *